(12) United States Patent
Amiot

(10) Patent No.: US 9,859,844 B1
(45) Date of Patent: Jan. 2, 2018

(54) POWER AMPLIFIER CIRCUIT AND METHOD OF DESIGN

(71) Applicant: Sebastien Amiot, Pleneuf Val Andre (FR)

(72) Inventor: Sebastien Amiot, Pleneuf Val Andre (FR)

( * ) Notice: Subject to any disclaimer, the term of this patent is extended or adjusted under 35 U.S.C. 154(b) by 0 days.

(21) Appl. No.: 15/289,860

(22) Filed: Oct. 10, 2016

(51) Int. Cl.
  *H03F 1/07* (2006.01)
  *H03F 1/02* (2006.01)
  *H03F 3/21* (2006.01)
  *H03F 1/56* (2006.01)

(52) U.S. Cl.
  CPC ........... *H03F 1/0205* (2013.01); *H03F 1/565* (2013.01); *H03F 3/21* (2013.01); *H03F 2200/165* (2013.01); *H03F 2200/171* (2013.01); *H03F 2200/255* (2013.01); *H03F 2200/423* (2013.01)

(58) Field of Classification Search
  CPC .......................................................... H03F 1/07
  USPC ..................... 330/124 R, 295, 302, 165, 276
  See application file for complete search history.

(56) References Cited

U.S. PATENT DOCUMENTS

| 5,355,095 | A | 10/1994 | Nathanson | |
|---|---|---|---|---|
| 5,491,449 | A | 2/1996 | Johnson | |
| 5,726,603 | A * | 3/1998 | Chawla | H03F 1/301 330/269 |
| 5,742,205 | A * | 4/1998 | Cowen | H03F 1/223 330/269 |
| 6,166,601 | A | 12/2000 | Shalom | |
| 6,172,565 | B1 | 1/2001 | Chen | |
| 6,639,461 | B1 | 10/2003 | Tam | |
| 7,477,105 | B2 * | 1/2009 | Simbuerger | H03F 1/0277 330/124 R |
| 8,351,877 | B2 | 1/2013 | Kim | |
| 8,467,747 | B2 | 6/2013 | Kim | |
| 8,798,181 | B1 | 8/2014 | Terry | |
| 9,379,680 | B1 | 6/2016 | Margomenos | |
| 9,379,745 | B2 | 6/2016 | Kim | |
| 9,673,848 | B2 | 6/2017 | Kim | |
| 9,685,915 | B2 | 6/2017 | Blendov | |

* cited by examiner

*Primary Examiner* — Henry Choe
(74) *Attorney, Agent, or Firm* — Patrick Reilly

(57) ABSTRACT

Structure and design methods of electrical power amplifiers suitable for broadband application such as television frequency or white spaces. An example broadband power amplifier passes a transmit carrier with modulations from BPSK to 256 QAM, on channel bandwidths from 6 to 32 MHz, over the entire UHF television band from 470 to 800 MHz using a low voltage, low power, narrowband power amplifier transistor. Based on a push-pull technique to lower the impedance level thus improving the match and doubling the power, the wide-band power amplification is performed with a balanced polynomial filter transform structure wherein the circuit impedance increases sequentially within the filter stage. The polynomial filtering makes high selectivity of out-of-band signals thereby cleaning up harmonic signals which prevent the need for additional high selective radio frequency filters. The invented power amplifier enables efficient broadband power amplifiers having a form factor within 300 square millimeters of space.

25 Claims, 14 Drawing Sheets

Polynomial multi-stage low-pass type impedance transform

POWER AMPLIFIER CIRCUIT AND METHOD OF DESIGN

FIELD OF THE INVENTION

The present invention relates to electrical circuitry design and structure. More particularly, the present invention relates to the structure and design methods of electrical power amplifiers.

BACKGROUND OF THE INVENTION

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

The advantages of employing broadband amplifiers that selectively apply electrical power to increase the output strength of input signals received within pre-specified frequency bands are desirable in many areas of electrical and electronic systems design, fabrication and use. In communications system technology, offered as one example and not intended as a limitation of the scope of the method of the present invention, the use of power amplifiers in transceiver architectures that provide signal amplification in frequency bands especially suited for the intended purpose of a system embodying a particular transceiver architecture offers many advantages. Firstly, the performance advantage of increasing signal strength primarily or essentially only in those frequency bands of interest to an intended user can be improved by knowledgeable power amplifier design. Secondly, conserving electrical power by expending energy primarily in providing the most desired output signal frequency bands reduces energy wastage, reduces cost of operations, and extends the time of effectiveness of an electrical battery or a capacitive source of electrical energy. Additional parameters of interest in a power amplifier design include (a.) reducing cost of components of the power amplifier circuit; (b.) reducing the required footprint and operating volume of the desired power amplifier circuit within its comprising system; (c.) imposing modest or little challenge in manufacturability of the desired power amplifier circuit within its comprising system; and (d.) imposing lower insertion loss performance by the desired power amplifier circuit upon its comprising system. It is understood that a reduction in insertion loss translates into an increased possible maximum output power, and thereby enables an improvement in overall power efficiency, of the comprising amplifier or transceiver.

Broadband power amplifiers in wireless communications systems preferably present transistor power matching over large frequency ranges. Furthermore, it is generally desirable in electronic systems adapted to transmit radio waves that a power amplifier present an impedance match having a radio characteristic impedance, e.g., 50 ohm or 75 ohm, to any coupled transistor impedance, wherein the target impedance is usually low ohmic due that may be caused by a high capacitive impedance resulting from by a relatively large transistor having a high drain current.

Prior art power amplifiers often use transformer topologies to generate a 180° phase shift and provide impedance matching. The prior art design approach to high frequency and broadband coverage includes applying topologies that include Ruthroff circuits and/or Guanella structures. These prior art circuits are usually used for broadband transform and deliver a four to ten impedance value obtained with a penalty up to 2 dB of insertion losses.

Some prior art alternatives provide cascaded transformers intended to optimize the phase shift in a first stage and then a transformer impedance characteristic in a second stage. As the mains terminal capacitors cause a low ohmic impedance of the power amplifier transistors, some designs use cascade structures to reduce the input or output capacitor in reliance upon the well-known Miller effect. The total resulting impedance of prior art power amplifiers may then be improved by introduction and use of a feedback network which reduces the power gain of the amplifier.

The prior art fails to offer optimized power amplifier designs that apply band pass filtering techniques and circuits that at least partially compensate for any performance effect imposed by the inclusion of simplified transformer elements within a power amplifier circuit.

SUMMARY OF THE INVENTION

Towards these objects and other objects that will be made obvious in light of the present disclosure presents and fully discloses an invented power amplifier and method of design therefore that avoid inclusion of relatively expensive transformer components. In accordance with the method of the present invention (hereinafter, "the invented method"), a power amplifier includes a pair of signal amplifying transistors and signal-filtering stages are separately positioned preferably one transistor of the pair of transistors. Each stage preferably provides both (a.) an inductance oriented in series with an inductance of one or more additionally electrically coupled stages, and (b.) a capacitance oriented in parallel with a capacitance of these one or more additionally electrically coupled stages. In combination, the plurality of signal filtering inductance-capacitance circuit stages filter out certain frequency contributions of a received input signal and cause an output amplified signal to be particularly responsive within pre-selected frequency signal bands.

In one optional aspect of the invented method, the signal filtering circuit stages coupled with an input feature of either transistor are coupled with and receive an input signal through a single winding transformer circuit, whereby the input signals are filtered prior to introduction to the signal input feature of the coupled transistor. In another optional aspect of the invented method, the signal filtering circuit stages that are coupled with a signal power output feature of one of the power amplifier transistors deliver a resultant amplified output signal from the coupled transistor and to a single winding transformer circuit.

In a still other optional aspect of the invented method, the signal filtering circuit stages coupled with an input feature of either transistor are coupled with and receive an input signal through a balun transformer circuit, whereby the input signals are filtered prior to introduction to the signal input feature of the coupled transistor. In a yet other optional aspect of the invented method, the signal filtering circuit stages that are coupled with a signal power output feature of one of the power amplifier transistors deliver a resultant amplified output signal from the coupled transistor and to another balun transformer circuit.

Certain alternate preferred embodiments of the invented method accommodate low cost components, such as transistors that evidence relatively high capacitance.

A first preferred embodiment of the invented method includes on ore more of the steps of (1.) determining one or more preferred bands of signal frequencies of which it is desired to increase in amplitude; (2.) the selection of an input and an output transformer that each approximately perform as comprising no more than a single winding, such as a balun transformer; (3.) selecting two power transistors of known electrical characteristics and tolerances; (4.) determining one or more inductor-capacitor stages that in series provide a desirable effect of filtering an input signal to reduce or eliminate frequencies outside of the preferred bands of signal frequencies; (5.) determining one or more inductor-capacitor stages that in series provide a desirable effect of filtering an output signal or one of the two transistors to reduce or eliminate frequencies outside of the preferred bands of signal frequencies; and (6.) selecting components, such as discrete components, to embody the design choices and preferences of the previous design steps. The selected components are then electrically coupled to a source of electrical energy form a power amplifier.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

These, and further features of the invention, may be better understood with reference to the accompanying specification and drawings depicting the preferred embodiment, in which:

FIG. 3A is an stepped filter that presents an abstraction of the structure of any one of the two input band pass circuits and the two output band pass circuits of FIG. 2A and FIG. 2B, wherein FIG. 3A is suitable for modeling a multi-stage low-pass or band pass type impedance transform circuit;

FIG. 3B is a visual graph representation of impedance matching of the multi-stage impedance transform circuit of FIG. 3A;

DETAILED DESCRIPTION

Figure 1:
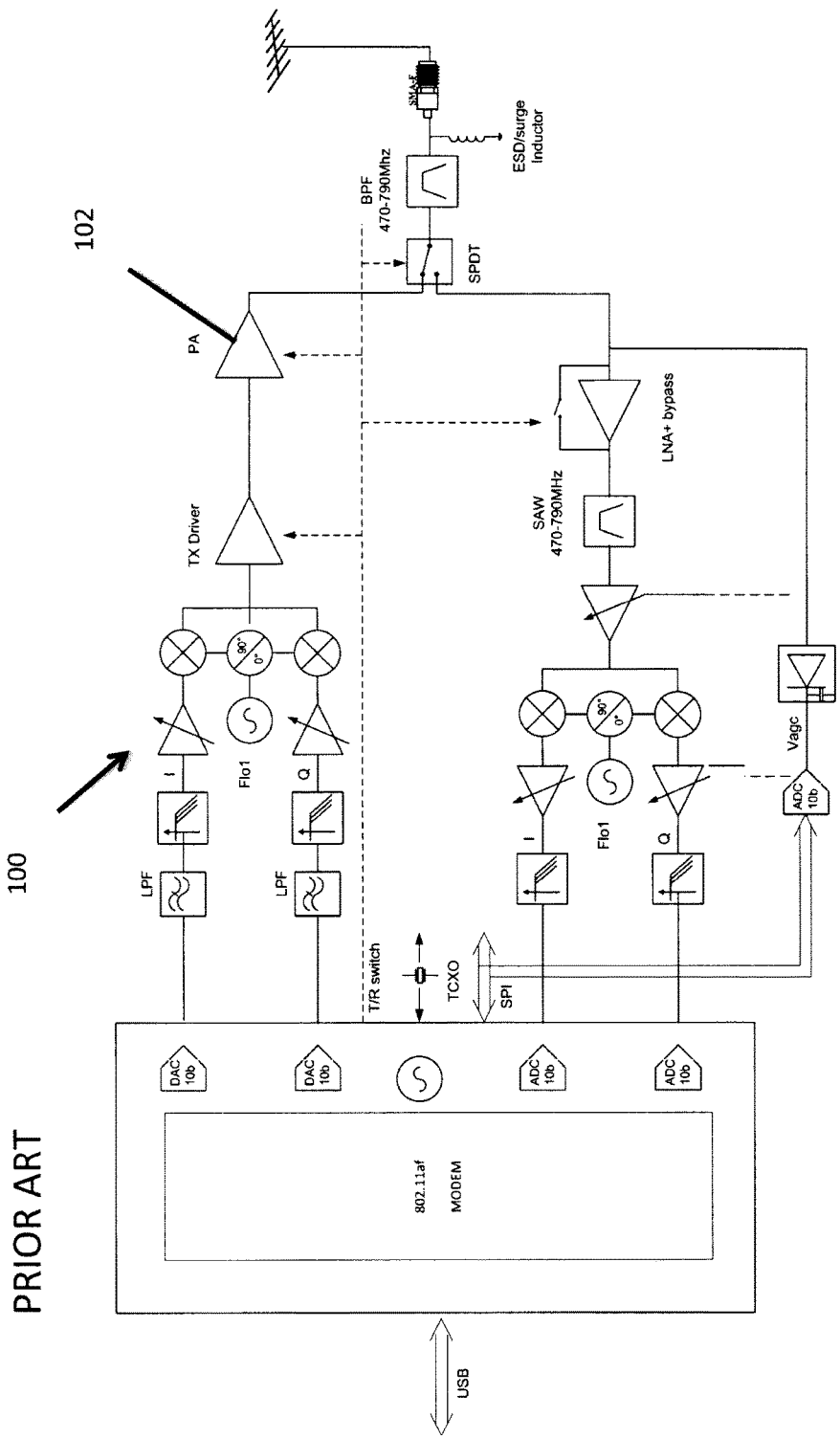
FIG. 1 is a schematic of a prior art wireless communications transceiver that includes a prior art power amplifier.

Referring now generally to the Figures and particularly to FIG. 1, FIG. 1 is a schematic of a prior art wireless communications transceiver 100 that includes a prior art power amplifier 102. It is understood that the schematic of FIG. 1 presents a prior art transceiver architecture within which certain alternate embodiments of the present invention may be integrated as, or within, a power amplifier.

Examples of electronic device products that may serve as or be comprised within the prior art power amplifier 102 include (a.) broadband transformer HHM1589 OCTOPART™ broadband transformer marketed by TDK of Tokyo, Japan and having a ratio 1 to 4; (b.) an RFXF6553™ broadband transformer marketed by MiniRF, Inc. of Fremont, Calif. and having a ratio 1 to 4, and (c.) DXP18BN5014H broadband transformer as marketed by Murata of Kyoto, Japan.

It is understood that the design of high frequency and broadband coverage communications equipment that various embodiments of these equipment types may employ or include either a Ruthroff transformer or a Guanella transformer structure, wherein prior art broadband transformer performance may present a four to ten impedance value with penalty up to 2 dB of insertion losses. Prior art power amplifier usually use those transformer topologies to generating the desired 180° phase shift and impedance matching. Some prior art alternatives also make use of cascaded transformers to optimize the desired phase shift in a first stage and then an impedance transform in a second stage. Since the mains terminal capacitors of many such prior art circuits cause a low ohmic impedance of the power amplifier transistors, some prior art designs use cascade structures to reduce an input or output capacitor in reliance upon the Miller effect, wherein the impedances of the prior art circuits are fine tuned with feedback network which reduces the power gain of the amplifier.

Figure 2A:
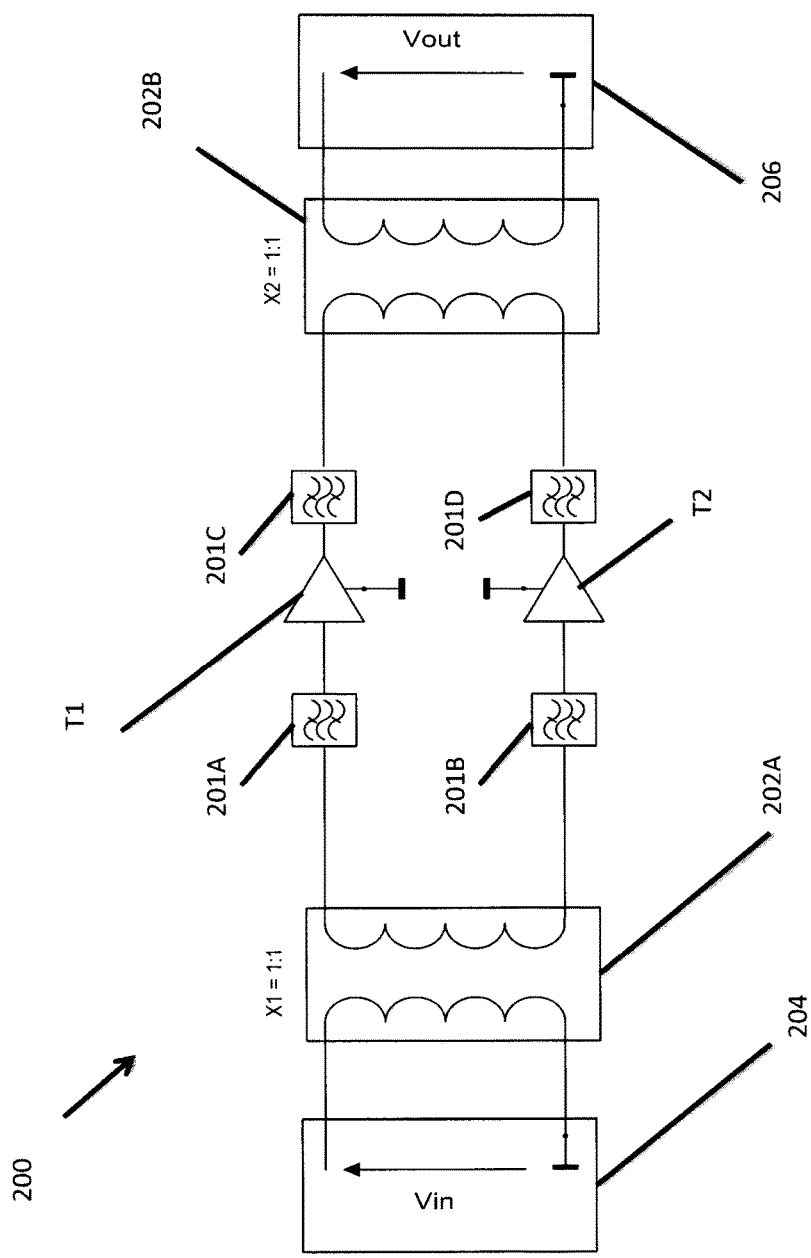
FIG. 2A is a schematic of a first preferred embodiment of the present invention wherein each of two power transistors are coupled with an input band pass circuit and an output band pass circuit.

Referring now generally to the Figures and particularly to FIG. 2A, FIG. 2A is a schematic of a first preferred embodiment 200 of the present invention wherein each of two power transistors T1 and T2 are each are coupled with an input band pass circuit 201A & 201B and an output band pass circuit 201C & 201D and comprising an input transformer 202A preferably presenting a 1:1 ratio and an output transformer 202B that is also preferably presenting a 1:1 ratio. The input transformer 202A is coupled to an input electrical power source 204. The output transformer 202B is coupled to an energy output circuit 206.

It is understood that the upper input band pass circuit 201A, the lower input band pass circuit 201B, the upper output band pass circuit 201C, and the lower output band pass circuit 201D each comprise inductor-capacitor stages (hereinafter, "LC stage(s)") as further disclosed and enabled herein.

The first transistor T1 and the second transistor T2 may be or comprise a Heterojunction Bipolar Transistor, a Laterally-Diffused Metal-Oxide Semiconductor, a Bipolar Junction Transistor (hereinafter, "BJT"), a Field Effect Transistor (hereinafter, "FET") such as, but not limited to a Heterojunction FET, a Metal Oxide Semiconductor FET, (hereinafter, "MOSFET"), and/or an other suitable transistor type known in the art.

Where the first transistor T1 and the second transistor T2 are each FET's, the drain of the first transistor T1 and the second transistor T2 are separately electrically coupled with an electrical power source (not shown), such as a battery or other suitable electrical power source known in the art. In addition, when the first transistor T1 and the second transistor T2 are each FET's, the upper input band pass circuit 201A is electrically coupled to a first gate terminal of the first transistor T1 and the upper output band circuit 201C is electrically coupled to the source terminal of the first transistor T1; the lower input band pass circuit 201B is electrically coupled to a second gate terminal of the second transistor T2 and the lower output band circuit 201D is electrically coupled to the source terminal of the second transistor T2.

Where the first transistor T1 and the second transistor T2 are each Bipolar transistors, the collector of the first transistor T1 and the collector of the second transistor T2 are separately electrically coupled with the electrical power source (not shown), such as a battery or other suitable electrical power source known in the art. In addition, when the first transistor T1 and the second transistor T2 are each individual Bipolar transistors, the upper input band pass circuit 201A is electrically coupled to a first base terminal of the first transistor T1 and the upper output band circuit 201C is electrically coupled to the emitter terminal of the first transistor T1; the lower input band pass circuit 201B is electrically coupled to a second base terminal of the second transistor T2 and the lower output band circuit 201D is electrically coupled to the emitter terminal of the second transistor T2.

It is understood that the first preferred embodiment 200 may be designed and embodied to operate as a Class A power amplifier, a Class B power amplifier, a Class AB power amplifier, or a Class C power amplifier. Accordingly, the first transistor T1 and the second transistor T2 are preferably selected from suitable transistor designs and products known in the art that support and enable the operation of the first preferred embodiment 200 to meet the generally accepted performance standard of the intended power amplifier Class.

Figure 2B:
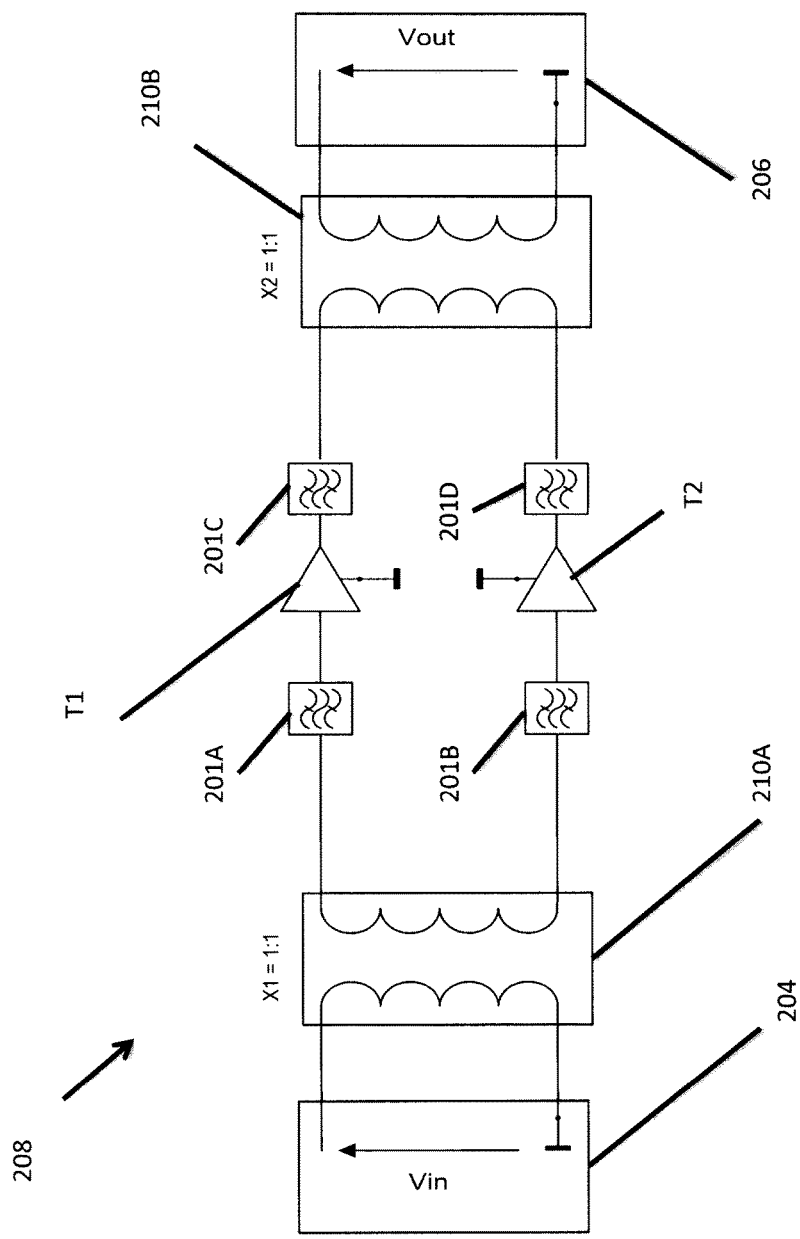
FIG. 2B is an alternate schematic of a second preferred embodiment of the present invention wherein each of the pair of input band pass circuits of FIG. 2A are coupled with an input balun circuit and each of the pair of output band pass circuits of FIG. 2A are coupled with an output balun circuit.

Referring now generally to the Figures and particularly to FIG. 2B, FIG. 2B is an alternate schematic of a second preferred embodiment of the present invention 208 (hereinafter, "the second invented power amplifier 208"), wherein each of the pair of input band pass circuits 201A & 201B are coupled with an input 1:1 balun circuit 210A and each of the pair of output band pass circuits 201C & 201D are coupled with an output 1:1 balun circuit. 210B.

The second invented power amplifier 208 has push-pull architecture with 1:1 balun at input and output. The second invented power amplifier 208 can achieve wide bandwidth required in some applications, such as TV white spaces 470-800 MHz, and evidence low insertion losses that improvements in power gain and output power and efficiency.

Once balanced, the impedance presented to the two active transistors T1 & T2 is half of the input or output impedance. If the termination of the second invented power amplifier 208 is at 50 Ohm, then 25 Ohm will be presented to each of the active transistors T1 & T2. In order to match this impedance to the input/output impedance of the active transistors T1 & T2 that can be as low as in the range of from one Ohm to five Ohms or alternatively higher in impedance. A stepped polynomial filter is then designed, integrated into, and used to smoothly adapt the impedance of the second invented power amplifier 208 such as the impedance matching second invented power amplifier 208 is guaranteed over a wide frequency range.

It is understood that second invented power amplifier 208 may be designed and embodied to operate as a Class A power amplifier, a Class B power amplifier, a Class AB power amplifier, or a Class C power amplifier. Accordingly, the first transistor T1 and the second transistor T2 are preferably selected from suitable transistor designs and products known in the art that support and enable the operation of the second invented power amplifier 208 to meet the generally accepted performance standard of the intended power amplifier Class.

Figure 3A:
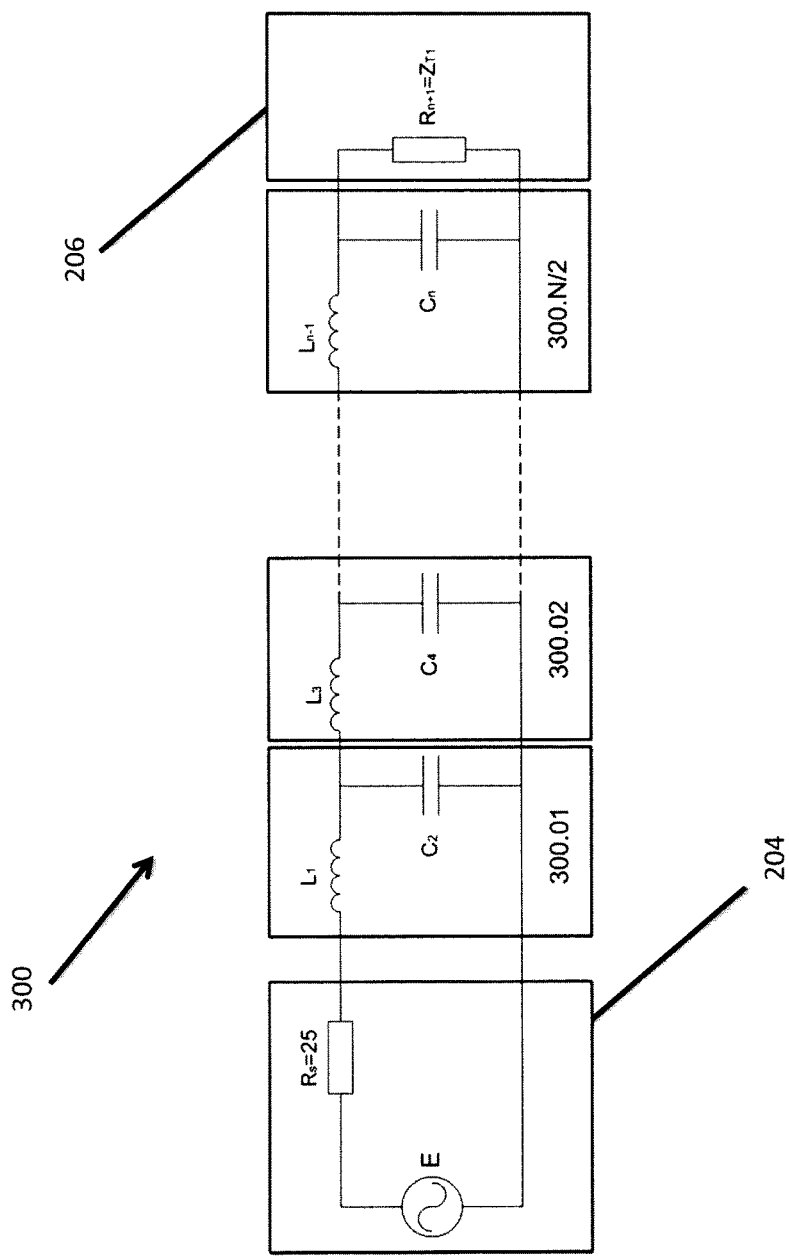

Referring now generally to the Figures and particularly to FIG. 3A, FIG. 3A presents the exemplary structure of a stepped band pass filter 300 that may be embodied by any one of the two input band pass circuits 201A & 201B and/or the two output band pass 201C & 201D circuits. It is understood that one or more of the two input band pass circuits 201A & 201B and/or the two output band pass 201C & 201D circuits may be structured and perform as a low band pass filter.

It is understood that the input electrical power source 204 comprises an energy source E and a source resistance Rs of 25 ohms and the energy output circuit 206 comprises an input resistance Rn+1.

The stepped filter 300 as embodied by any of the band pass circuits 201A, 201B, 201C & 201D includes a plurality of LC stages 300.A-300.N/2, wherein N is an arbitrarily large number that is greater than the number one. A first stage 300.A includes a first inductor L1 that is placed in series with the other LC stages 300.A-300.N and a first capacitor C2 that is placed in parallel with the other LC stages 300.B-300.N. A second stage 300.B includes (1.) a second inductor L3 that is placed in series with the other LC stages 300.A & 300.N, and (2.) a second capacitor C4 that is placed in parallel with the other LC stages 300.A-300.N. A Nth stage 300.N includes (1.) an Nth inductor Ln-1 that is placed in series with the other LC stages 300.A & 300.B, and (2.) Nth capacitor Cn that is placed in parallel with the other LC stages 300.A-300.N.

Figure 3B:
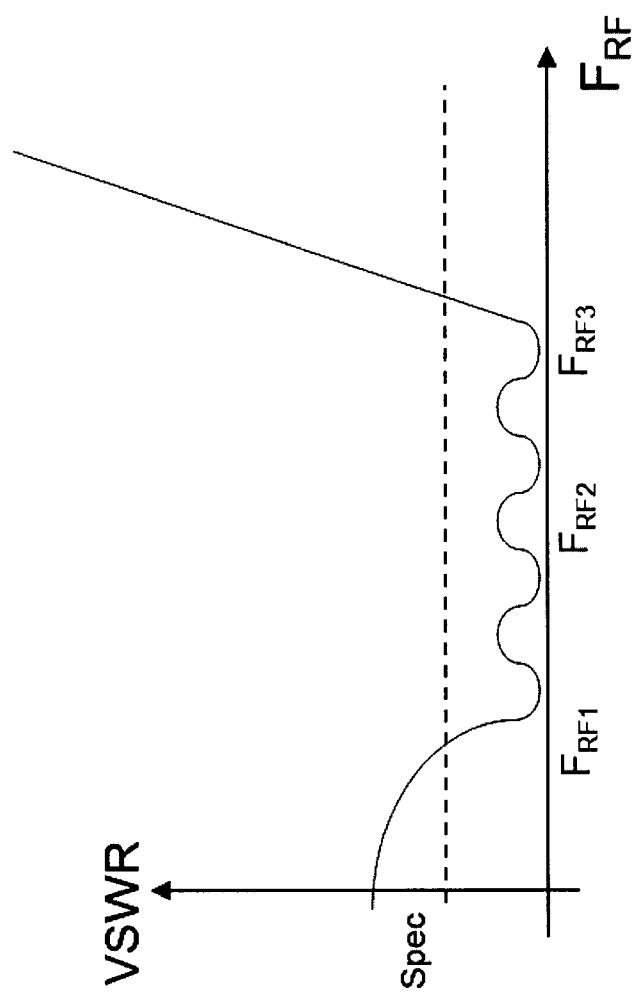
FIG. 3B is a representation of a Voltage Standing-Wave Ratio (hereinafter, "VSWR") signal frequency filtering performance in Cartesian coordinates of a circuit structured in accordance with the stepped filter design of FIG. 3A, i.e.

Referring now generally to the Figures and particularly to FIG. 3B, FIG. 3B is a representation of a VSWR frequency filtering performance in Cartesian coordinates of a band pass circuit 201A, 201B, 201C & 201D structured in accordance with the idealized schematic of the stepped filter 300.

Figure 3C:
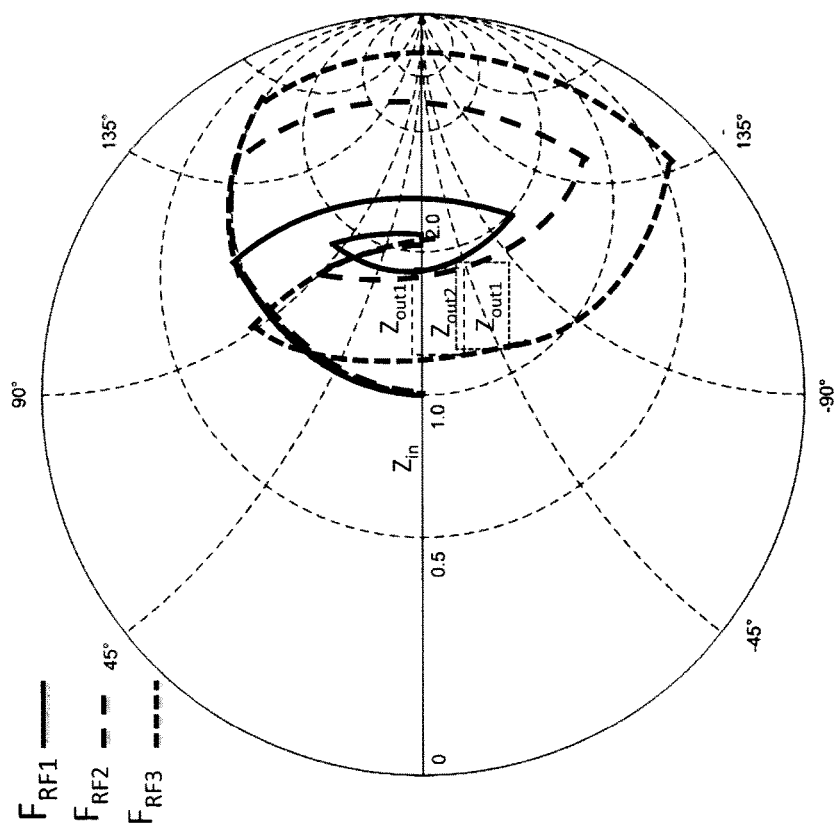
FIG. 3C is a representation of a wide-band impedance transform performance in polar coordinates of a circuit structured in accordance with the stepped filter, or multi-stage impedance transform circuit, of FIG. 3A.

Referring now generally to the Figures and particularly to FIG. 3C, FIG. 3C is a representation of a signal frequency filtering performance in polar coordinates of a band pass circuit 201A, 201B, 201C & 201D structured in accordance with the stepped filter 300.

Figure 4:
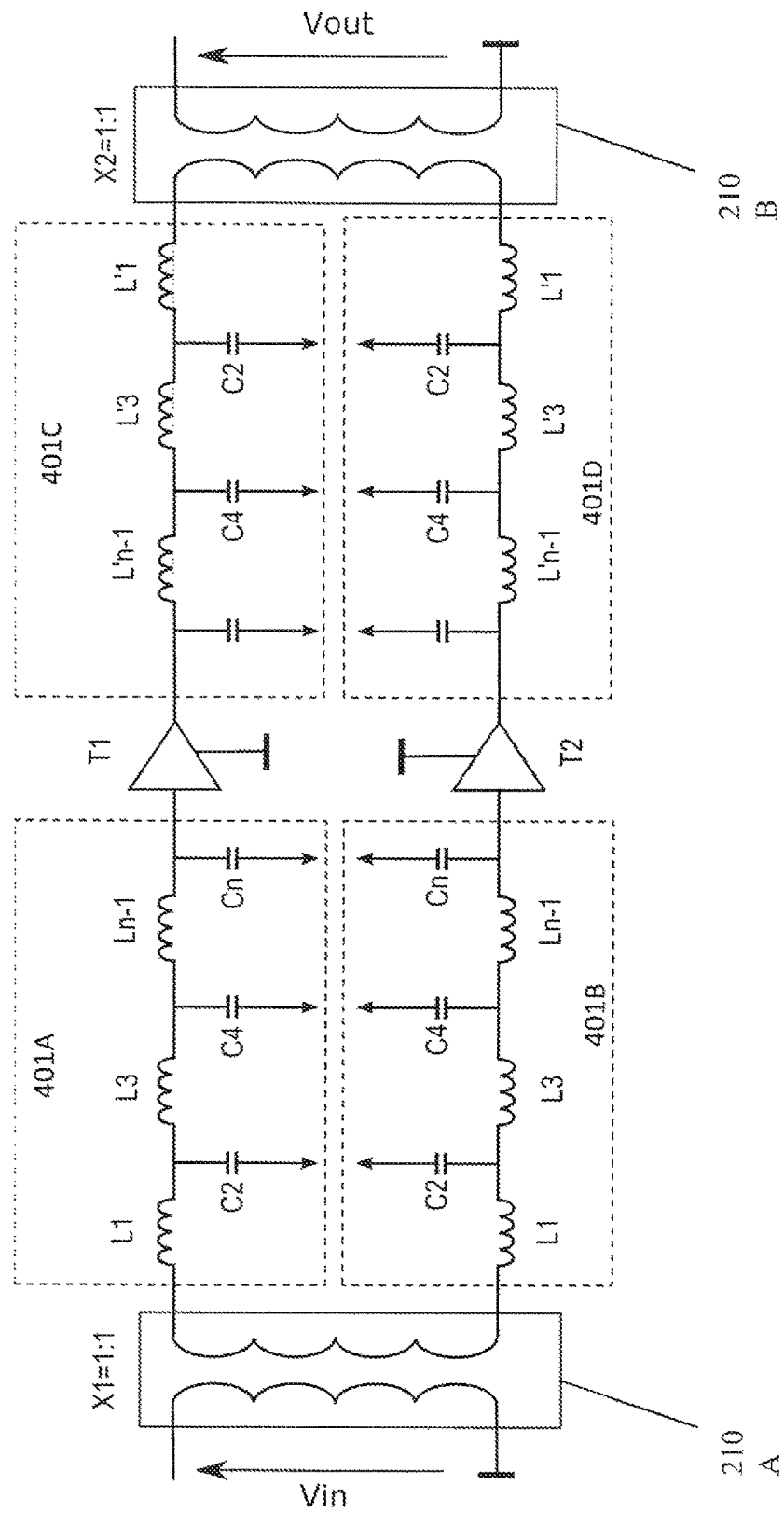
FIG. 4 is an additional schematic that presents an abstraction of a power amplifier designed and structured in accordance with the invented method.

Referring now generally to the Figures and particularly to FIG. 4, FIG. 4 is an additional schematic that presents an abstraction of an exemplary third invented power amplifier 400 designed and structured in accordance with the invented method. The third invented power amplifier 400 includes (1.) an alternate upper input band pass filter 401A comprising three LC stages coupled with an input of the first transistor T1; (2.) an alternate lower input band pass filter 401B comprising three LC stages coupled with an input of the second transistor T2; (3.) an alternate upper output band pass filter 401C comprising two LC stages coupled with the output of the first transistor T1; and (4.) an alternate lower output band pass filter 401D comprising two LC stages coupled with the output of the second transistor T2.

It is understood that the impedance characteristics of the components of the third invented power amplifier 400 may be chosen and selected in accordance with a generation of a polynomial expression comprising Chebychev coefficients, whereby a preferred distribution of resonator frequency of each LC filter stage of each the alternate band pass filter 401A, 401B, 401C & 401D giving a more desirable or lowest insertion loss and improved or best frequency bandwidth for the third invented power amplifier 400.

It is further understood that the third invented power amplifier 400 may be designed and embodied to operate as a Class A power amplifier, a Class B power amplifier, a Class AB power amplifier, or a Class C power amplifier. Accordingly, the first transistor T1 and the second transistor T2 are preferably selected from suitable transistor designs and products known in the art that support and enable the operation of the second invented power amplifier 208 to meet the generally accepted performance standard of the intended power amplifier Class.

The third invented power amplifier 400 has been implemented as a device having a footprint of less than 250 square millimeters and delivering 2.5 Watts in output signal energy in consuming five Watts of electrical power from a five Volt supply. In contrast, a typical prior art power amplifier reference design as marketed by Triquint of Hillsboro, Oreg. based on the inclusion of a more expensive transformer element presents a 380 square millimeter footprint and consumes 10 W with 12 Volt, 24 Volt or 28 Volt power source and delivers only two Watts in max output signal power.

The third invented power amplifier 400 can be embodied with a 1:1 balun transformer having insertion losses in the range of from 0.5 decibel to 0.7 dB whereas a prior art power amplifier that incorporates a prior art broadband transformer would more typically present a 1.5 decibel to 2.0 decibel insertion loss.

Prior art design techniques typically require trade off decisions in insertion loss magnitude versus balancing or phase shift of the prior art transformer, so designers have generally preferred in the prior art to prefer to cascade two transformers, wherein a first transformer provides the desired phase shifting and a second transformer provides for an impedance transform. Prior art power amplifier transforms thus often evidence the power losses in the range form 2.0 decibels to 2.5 decibels which directly impact the maximum output power to delivered by the prior art device, and therefore efficiency of the prior art device.

Figure 5A:
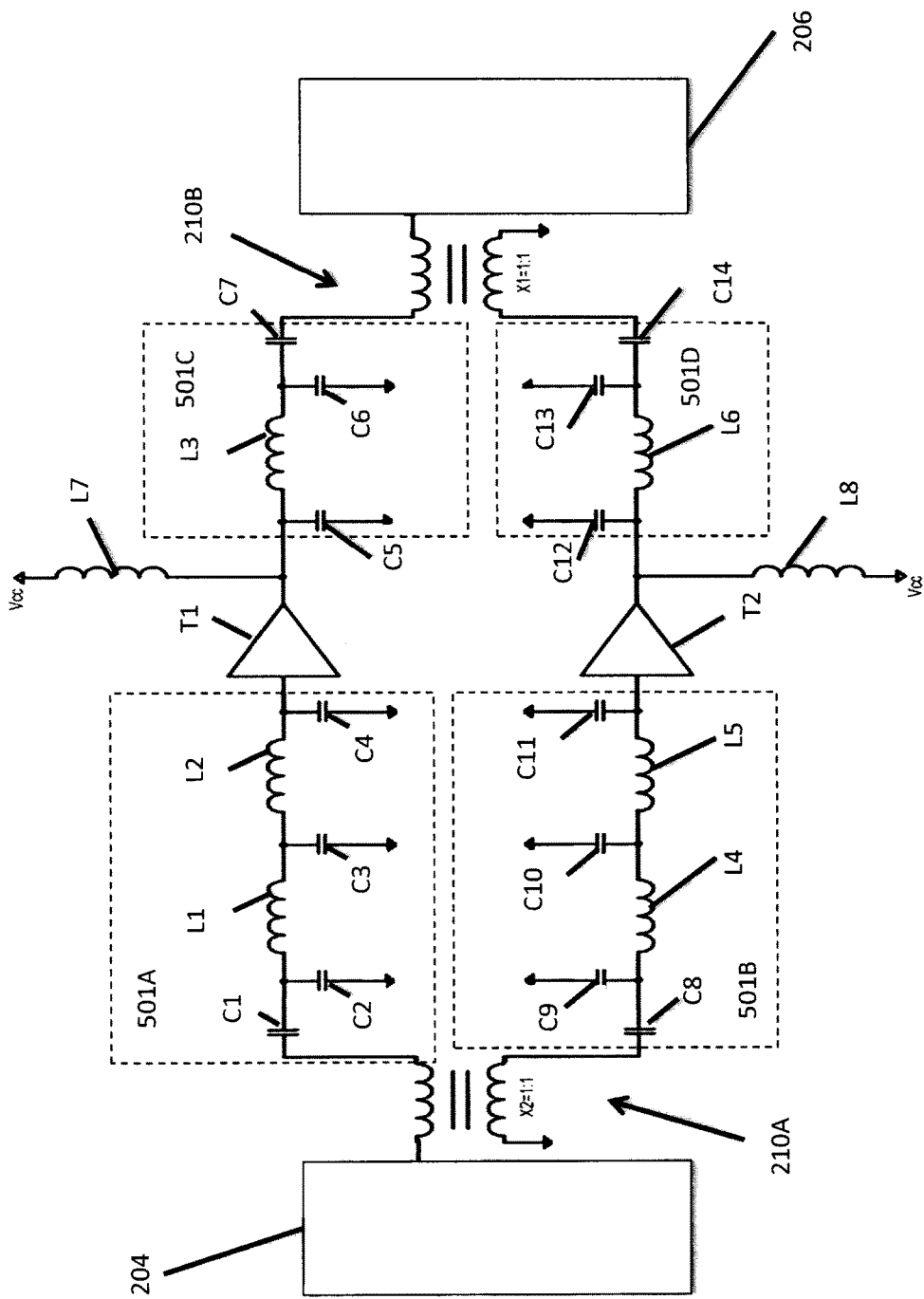
FIG. 5A is circuit schematic that presents an abstraction of a first invented power amplifier designed and structured in accordance with the invented method and presented with specific and enumerated capacitive and inductance values and effects.

Referring now generally to the Figures and particularly to FIG. 5A, FIG. 5A is circuit schematic of an exemplary fourth invented power amplifier 500 designed and structured in accordance with the invented method and presented with specific and enumerated capacitive and inductance values and effects.

The fourth invented power amplifier 500 includes four still alternate band pass filters 501A, 501B, 501C & 501D, the input 1:1 balun circuit 210A, and the output 1:1 balun circuit. The still alternate upper input band pass filter 501A comprises a first capacitor C1 positioned in series with the first transistor T1, a second capacitor C2 positioned in parallel with the first transistor T1, a first inductor L1 positioned in series with the first transistor T1, a third capacitor C3 positioned in parallel with the first transistor T1, a second inductor L2 positioned in series with the first transistor T1, and a fourth capacitor C4 positioned in parallel with the first transistor T1. It is understood that the first inductor L1 and the third capacitor C3 form a band pass filter stage of the still alternate upper input band pass filter 501A and further that the a second inductor L2 and the fourth capacitor C4 also form a band pass filter stage of the still alternate upper input band pass filter 501A.

Exemplary values of impedance characteristics of the elements of the still alternate upper input band pass filter 501A include 100 pF of capacitance for the first capacitor C1; 15 pF of capacitance for the second capacitor C2; 22 pF of capacitance for the third capacitor C3; 33 pF of capacitance for the fourth capacitor C4; 3.9 nH of inductance for the first inductor L1; and 1.3 nH of inductance for the second inductor L2.

The still alternate upper output band pass filter 501C comprises a fifth capacitor C5 positioned in series with the output gate of the first transistor T1, a third inductor L3 positioned in series with the output gate of the first transistor T1, a sixth capacitor C6 positioned in parallel with the output gate of the first transistor T1, and a seventh capacitor C7 positioned in series with the output gate of the first transistor T1. It is understood that the third inductor L3 and the sixth capacitor C6 form a band pass filter stage of the still alternate upper output band pass filter 501C.

Exemplary values of impedance characteristics of the elements of the still alternate upper output band pass filter 501C include 47 pF of capacitance for the fifth capacitor C5; 12 pF of capacitance for the sixth capacitor C6; 100 pF of capacitance for the seventh capacitor C7; and 4.3 nH of inductance for the third inductor L3.

The still alternate lower input band pass filter 501B comprises an eighth capacitor C8 positioned in series with the second transistor T2, a ninth capacitor C9 positioned in parallel with the second transistor T2, a fourth inductor L4 positioned in series with the second transistor T2, a tenth capacitor C10 positioned in parallel with the second transistor T2, a fifth inductor L5 positioned in series with the second transistor T2, and an eleventh capacitor C11 positioned in parallel with the second transistor T2. It is understood that the fourth inductor L4 and the tenth capacitor C10 form a band pass filter stage of the still alternate lower input band pass filter 501B and further that the fifth inductor L5 and the eleventh capacitor C11 also form a band pass filter stage of the still alternate lower input band pass filter 501B.

Exemplary values of impedance characteristics of the elements of the still alternate upper input band pass filter 501B include 100 pF of capacitance for the eighth capacitor C8; 15 pF of capacitance for the ninth capacitor C9; 22 pF of capacitance for the tenth capacitor C10; 33 pF of capacitance for the eleventh capacitor C11; 3.9 nH of inductance for the fourth inductor L4; and 1.3 nH of inductance for the fifth inductor L5.

The still alternate lower output band pass filter 501D comprises a twelfth capacitor C12 positioned in series with the output gate of the second transistor T2, a sixth inductor L6 positioned in series with the output gate of the second transistor T2, a thirteenth capacitor C13 positioned in parallel with the output gate of the second transistor T2, and a fourteenth capacitor C14 positioned in series with the output gate of the second transistor T2. It is understood that the sixth inductor L6 and the fourteenth capacitor C14 form a band pass filter stage of the still alternate lower output band pass filter 501D.

Exemplary values of impedance characteristics of the elements of the still alternate lower output band pass filter 501D include 47 pF of capacitance for the twelfth capacitor C12; 12 pF of capacitance for the thirteenth capacitor C13; 100 pF of capacitance for the fourteenth capacitor C7; and 4.3 nH of inductance for the sixth inductor L6

The fourth invented power amplifier 500 further comprises a pull up inductor L7 coupled with the output gate of the first transistor T1 and a local DC power source Vcc and a pull down inductor L8 coupled with the output gate of the second transistor T2 and the local DC power source Vcc.

Figure 5B:
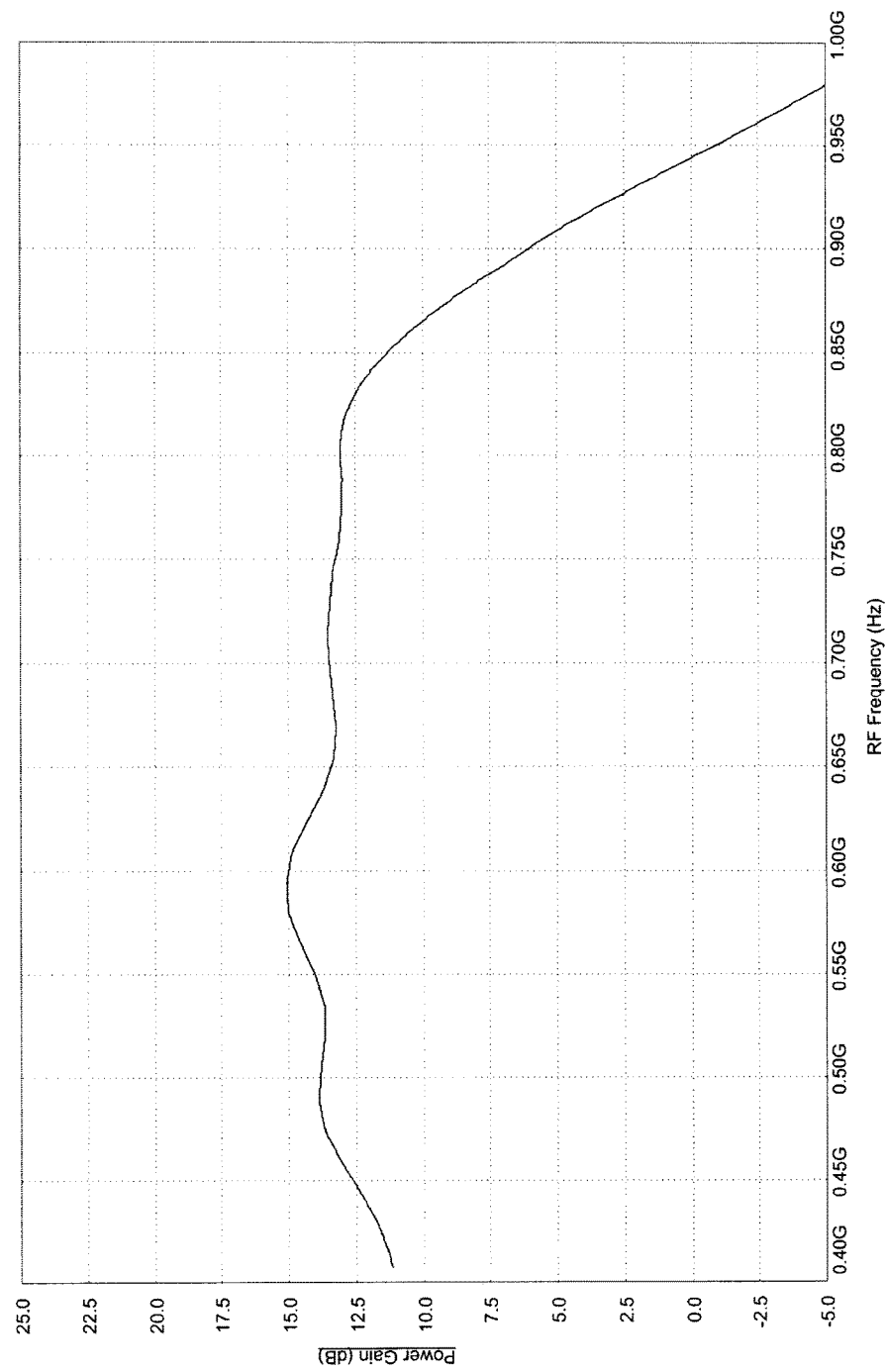
FIG. 5B is a graph in Cartesian coordinates of a simulated amplifier gain calculated in view of the enumerated capacitive and inductance values and effects of the invented power amplifier of FIG. 5A.

Referring now generally to the Figures and particularly to FIG. 5B, FIG. 5B is a graph in Cartesian coordinates of a simulated amplifier gain calculated in view of the enumerated capacitive and inductance values and effects of the fourth invented power amplifier 500.

Figure 5C:
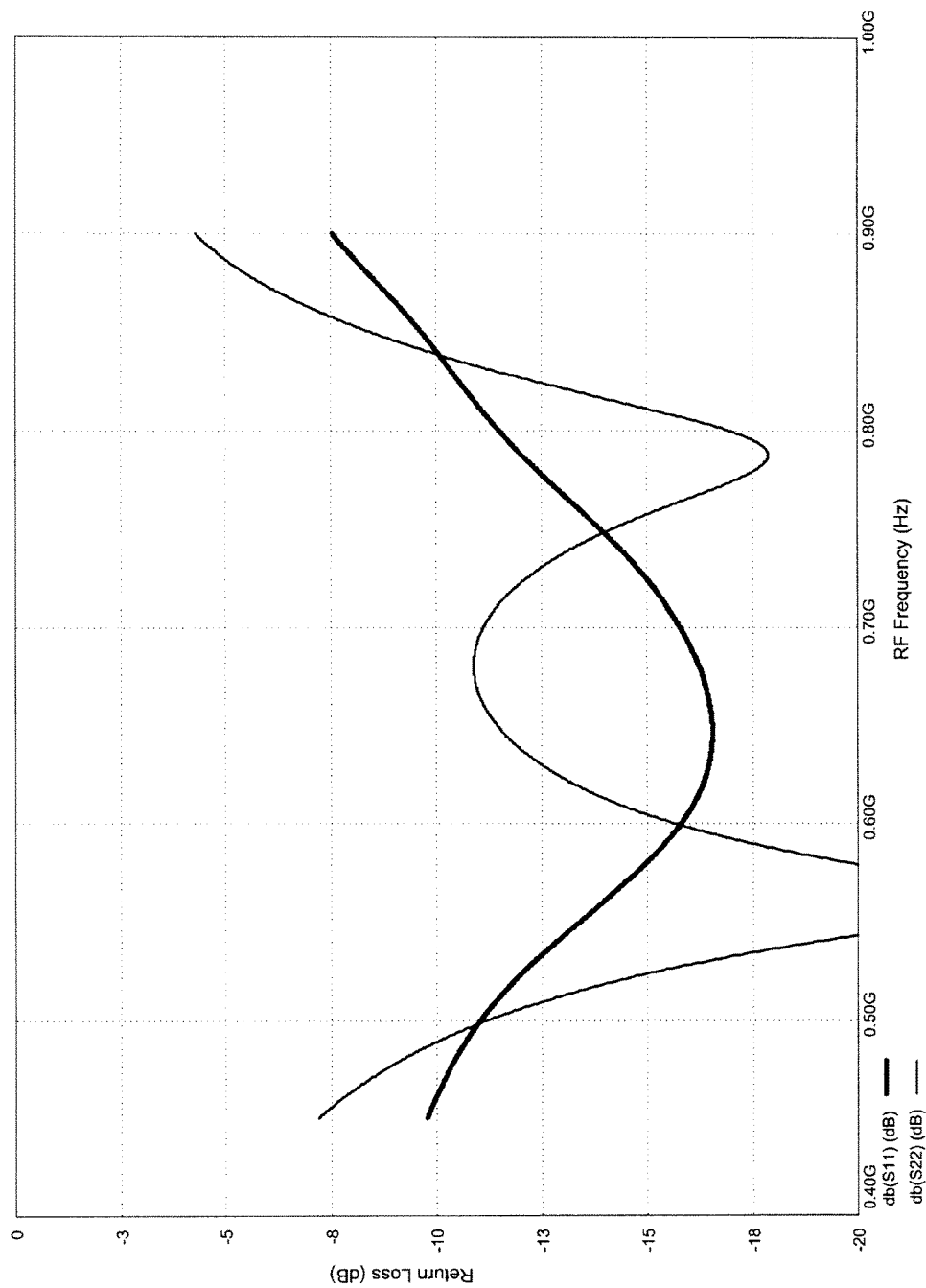
FIG. 5C is a graph in Cartesian coordinates of a simulated broadband amplifier input/output return loss, image of the impedance calculated in view of the enumerated capacitive and inductance values and effects of the invented power amplifier of FIG. 5A.

Referring now generally to the Figures and particularly to FIG. 5C, FIG. 5C is a graph in Cartesian coordinates of a simulated broadband amplifier input/output impedance calculated in view of the enumerated capacitive and inductance values and effects of the fourth invented power amplifier 500.

Figure 5D:
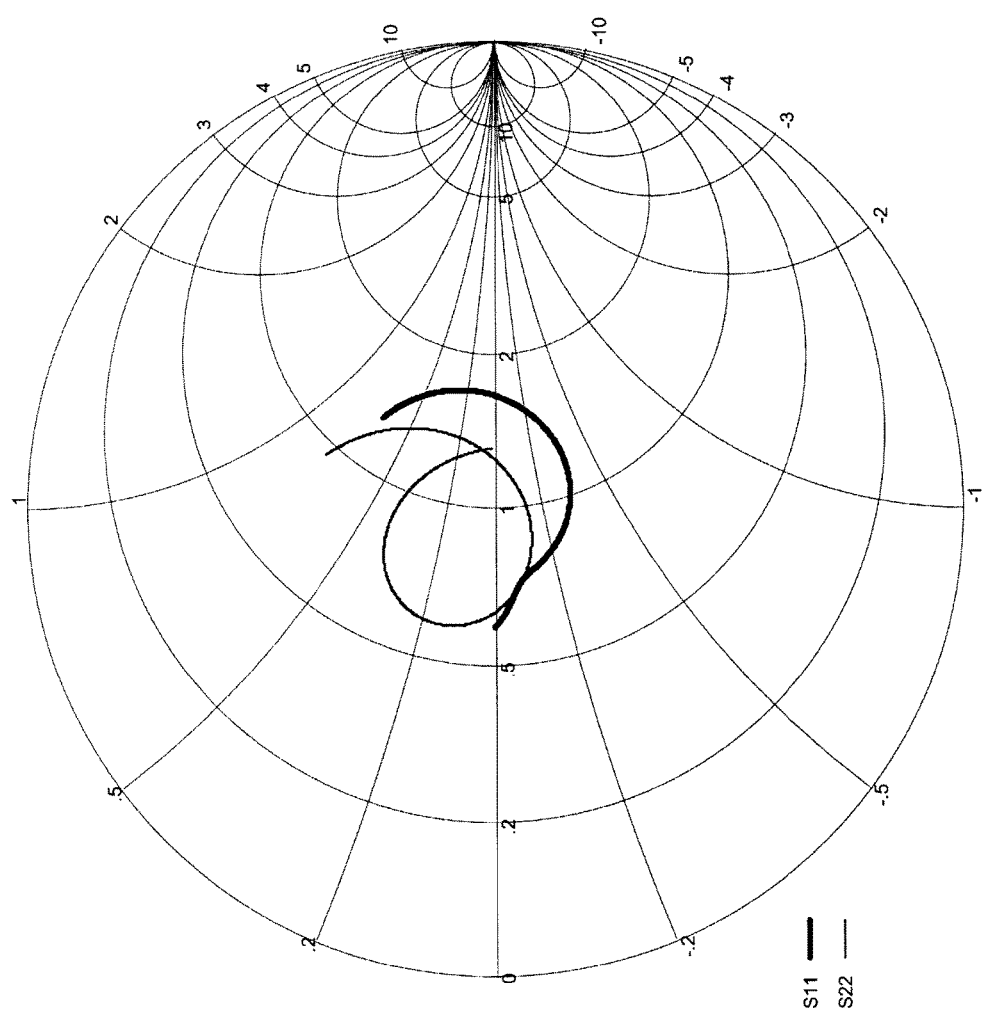
FIG. 5D is a graph in polar coordinates of a simulated broadband amplifier input/output impedance calculated in view of the enumerated capacitive and inductance values and effects of the invented power amplifier of FIG. 5A.

Referring now generally to the Figures and particularly to FIG. 5D, FIG. 5D is a graph in polar coordinates of a simulated broadband amplifier input/output impedance calculated in view of the enumerated capacitive and inductance values and effects of the fourth invented power amplifier 500.

Figure 6:
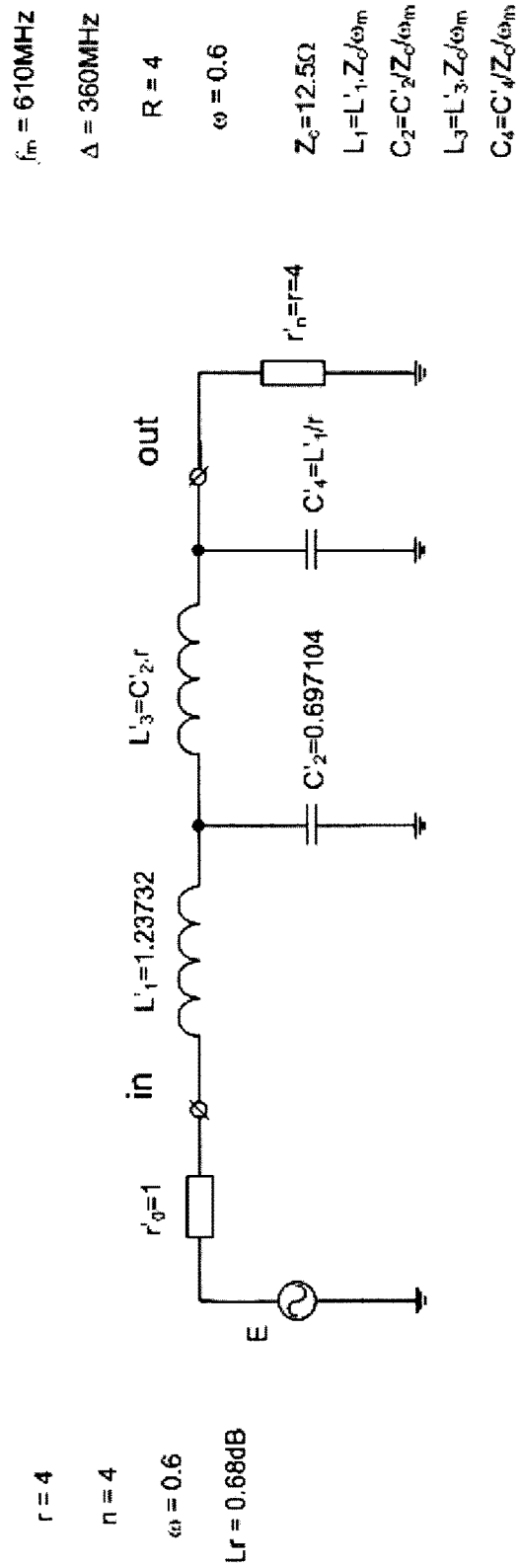
FIG. 6 presents an application of a prior art technique to derive inductance values and capacitance values for elements of two band pass filter stages of FIG. 3A of the invented band pass filters of FIGS. 2A, 2B, 4, and 5A.

Referring now generally to the Figures and particularly to FIG. 6, FIG. 6 presents an application of a prior art technique to derive inductance values and capacitance values for elements of two band pass filter stages 300.01-300.N/2 of the invented filters 201A-201D, 401A-401D & 501A-501D.

Figure 7:
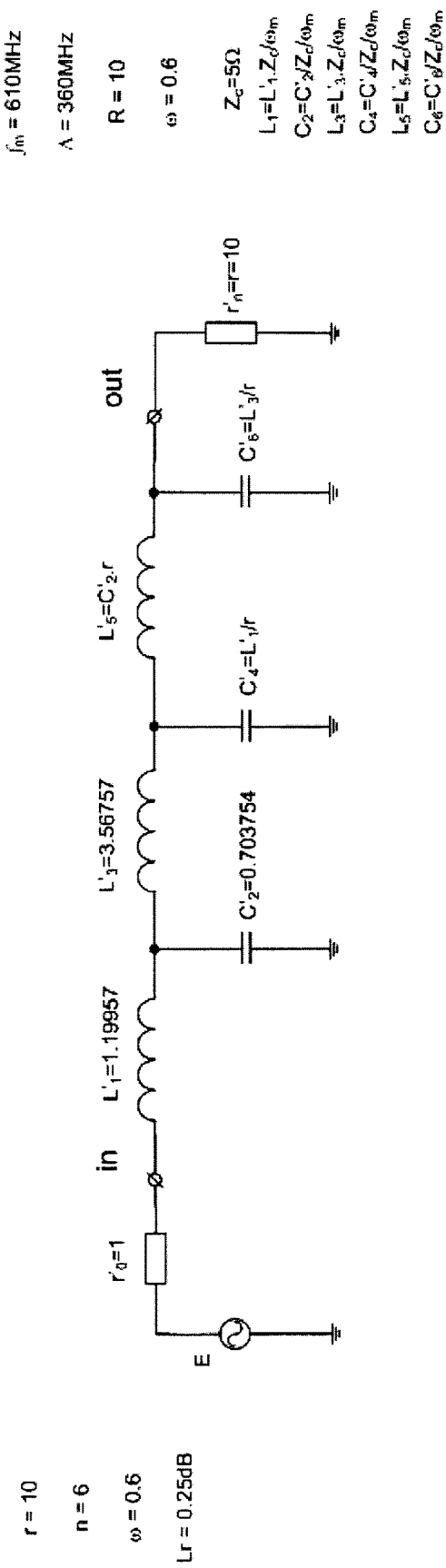
FIG. 7 presents an application of a prior art technique to derive inductance values and capacitance values for elements of three band pass filter stages FIG. 3A of the invented band pass filters of FIGS. 2A, 2B, 4, and 5A.

Referring now generally to the Figures and particularly to FIG. 7, FIG. 7 presents an application of a prior art technique to derive inductance values and capacitance values for elements of three band pass filter stages 300.01-300.N/2 of the invented filters 201A-201D, 401A-401D & 501A-501D.

Figure 8:
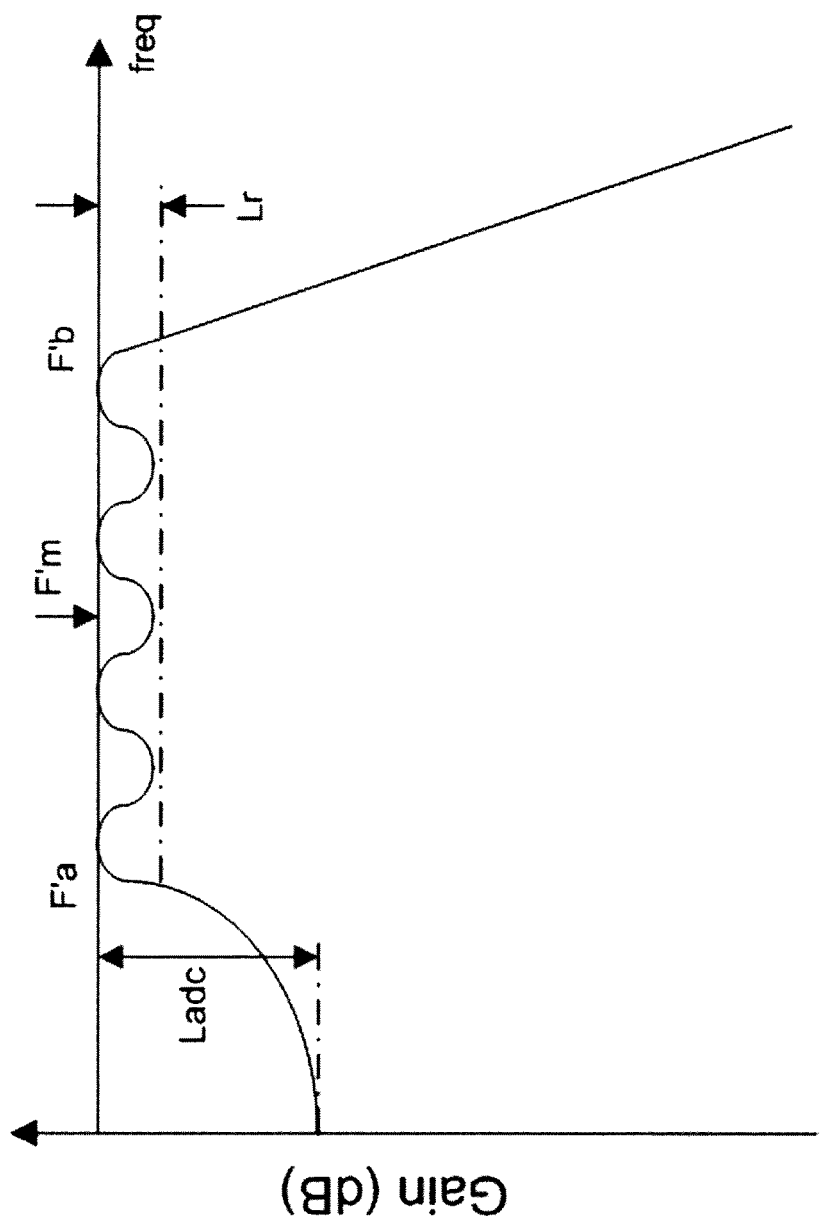
FIG. 8 presents a desired frequency response of a three band pass filter stages of FIG. 7.

Referring now generally to the Figures and particularly to FIG. 8, FIG. 8 presents a desired frequency response of a three band pass filter stages 300.01-300.N/2 of the invented filters 201A-201D, 401A-401D & 501A-501D.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Additionally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based herein. Accordingly, the disclosure of the embodiments of the invention is intended to be illustrative, but not limiting, of the scope of the invention, which is set forth in the following claims.

What is claimed is:

1. An electronic circuit comprising:
   a single-ended input port;
   an input transformer;
   an output transformer;
   a single-ended output port; and
   two single-ended amplifier legs connected from the input transformer to the output transformer, each related to a local DC power source and a local ground, both single-ended amplifier legs consisting, in order from input to output, of a first passive band-pass filter, a power amplifier, and a second passive band-pass filter, and wherein the first passive band-pass filter consists of, in order from input to output, of a series of stages where the stages are composed by a shunt capacitor to the local ground and an inductor in series, wherein each component value of each stages may be expressed as a polynomial.

2. The electronic circuit of claim 1 where the input transformer ratio and the output transformer ratio are both 1:1.

3. The electronic circuit of claim 1 where the power amplifier consists of a single transistor.

4. The electronic circuit of claim 1, wherein the single transistor is a selected from a transistor group consisting of a Bipolar transistor, a Field Effect Transistor, a Metal Oxide Semiconductor Field Effect Transistor, and a hetero-junction transistor.

5. The electronic circuit of claim 1 where the power amplifier consists of two or more transistors with their emitters/sources connected in series.

6. The electronic circuit of claim 1 where the power amplifier consists of a transistor with its emitter/source connected to the local ground and its collector/drain connected to the emitter/source of a transistor with its base/gate connected to the local ground.

7. The electronic circuit of claim 1 where the two power amplifiers are driven by a same signal 180 degrees out of phase.

8. The electronic circuit of claim 1 where the input transformer is a transmission line transformer.

9. The electronic circuit of claim 1 where the output transformer is a Ruthroff transformer.

10. The electronic circuit of claim 1 where the input transformer has a middle access termination.

11. The electronic circuit of claim 1, wherein each power amplifier is supplied with high impedance inductor connected to the local DC power source.

12. The electronic circuit of claim 1 where the output transformer has middle access termination.

13. An electronic circuit comprising:
   a single-ended input port;
   an input transformer;
   an output transformer;
   a single-ended output port; and
   two single-ended amplifier legs connected from the input transformer to the output transformer, each related to a local DC power source and a local ground, both single-ended amplifier legs consisting, in order from input to output, of a first passive band-pass filter, a power amplifier, and a second passive band-pass filter, wherein the first passive band-pass filter consists of, in order from input to output, of a first capacitor in series, a second capacitor to the local ground, a first inductor in series, a third capacitor to the local ground, a second inductor in series, and a fourth capacitor to the local ground.

14. The electronic circuit of claim 1 where the first passive band-pass filter is adapted to perform as an impedance transform.

15. The electronic circuit of claim 1, wherein each component value of each stage of the first passive band-pass filter may be expressed as a Chebychev polynomial.

16. The electronic circuit of claim 1 where the second passive band-pass filter is adapted to perform an impedance transform.

17. The electronic circuit of claim 1 where the second passive band-pass filter consists of, in order from input to output, of a series of stages wherein each stages comprises an inductors in series and a shunt capacitor connected to the local ground, whereby each component values of each stage may expressed as a polynomial equation such as a Chebychev polynomial.

18. An electronic circuit comprising:
a single-ended input port;
an input transformer;
an output transformer;
a single-ended output port; and
two single-ended amplifier legs connected from the input transformer to the output transformer, each related to a local DC power source and a local ground, both single-ended amplifier legs consisting, in order from input to output, of a first passive band-pass filter, a power amplifier, and a second passive band-pass filter, wherein the second passive band-pass filter consists of, in order from input to output, a third inductor to the local DC power source, a fifth capacitor to the local ground, a fourth inductor in series, a sixth capacitor to the local ground, and a seventh capacitor in series.

19. The electronic circuit of claim 18, wherein the first passive band-pass filter consists of, in order from input to output, of a first capacitor in series, a second capacitor to the local ground, a first inductor in series, a third capacitor to the local ground, a second inductor in series, and a fourth capacitor to the local ground.

20. The electronic circuit of claim 19, wherein the second passive band-pass filter consists of, in order from input to output, a third inductor to the local DC power source, a fifth capacitor to the local ground, a fourth inductor in series, a sixth capacitor to the local ground, and a seventh capacitor in series.

21. The electronic circuit of claim 1 where the passive band-pass filter is a low-pass filter.

22. The electronic circuit of claim 1 where the power amplifier is adapted to operate in accordance with class A.

23. The electronic circuit of claim 1 where the power amplifier is adapted to operate in accordance with class AB.

24. The electronic circuit of claim 1 where the power amplifier is adapted to operate in accordance with class B.

25. The electronic circuit of claim 1 where the power amplifier is adapted to operate in accordance with class C.

* * * * *